(12) United States Patent
Li et al.

(10) Patent No.: US 6,667,182 B2
(45) Date of Patent: Dec. 23, 2003

(54) METHOD FOR MAKING FERROELECTRIC THIN-FILM, SENSOR AND THE FERROELECTRIC THIN-FILM ELEMENT

(75) Inventors: Xiao-min Li, Kurita-gun (JP); Katsuhiko Tanaka, Ibaraki (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/804,375

(22) Filed: Mar. 12, 2001

(65) Prior Publication Data

US 2001/0042877 A1 Nov. 22, 2001

(30) Foreign Application Priority Data

Mar. 15, 2000 (JP) .......................... 2000-072758

(51) Int. Cl.[7] .......................... H01L 21/00; H01L 21/66
(52) U.S. Cl. .............................. 438/3; 438/50; 438/52; 438/53
(58) Field of Search .............................. 438/3, 50, 52, 438/53; 257/295

(56) References Cited

U.S. PATENT DOCUMENTS

| 5,387,459 A | * | 2/1995 | Hung .......................... 428/209 |
| 5,514,484 A | * | 5/1996 | Nashimoto ................... 428/700 |
| 5,684,302 A | * | 11/1997 | Wersing et al. .......... 250/338.3 |
| 5,776,621 A | * | 7/1998 | Nashimoto ................... 428/688 |
| 6,291,140 B1 | * | 9/2001 | Andreoli et al. ............. 430/322 |
| 6,358,861 B1 | * | 3/2002 | Ohji et al. ................... 438/746 |
| 6,365,055 B1 | * | 4/2002 | Weber et al. ................... 216/2 |

OTHER PUBLICATIONS

H. Ohji, P.J. Trimp, and P.J. French, "Fabrication of Free Standing Structure Using Single Step Electrochemical Etching in Hydrofluoric Acid," IEEE, (1998), pp. 246–250.*

* cited by examiner

Primary Examiner—Tom Thomas
Assistant Examiner—Thomas Magee
(74) Attorney, Agent, or Firm—Keating & Bennett, LLP

(57) ABSTRACT

A ferroelectric thin-film element has a Si substrate and a thin-film laminate formed on the Si substrate, the thin-film laminate being a buffer layer epitaxially grown on the Si substrate, a metallic thin film lower electrode epitaxially grown on the buffer layer, a ferroelectric thin film orientationally grown or epitaxially grown on the lower electrode, and an upper electrode formed on the ferroelectric thin film. A portion of the thin-film laminate may be supported by air.

9 Claims, 5 Drawing Sheets

METHOD FOR MAKING FERROELECTRIC THIN-FILM, SENSOR AND THE FERROELECTRIC THIN-FILM ELEMENT

BACKGROUND OF THE INVENTION

1. Field of the Invention

The present invention relates to ferroelectric thin-film elements formed on Si substrates using thin-film deposition techniques, and sensors using the same, and also relates to methods for making the same.

2. Description of the Related Art

Recently, the demand for elements using ferroelectrics are rapidly increasing. Acceleration sensors using the piezoelectricity of ferroelectric thin-film elements and pyroelectric infrared sensors using the pyroelectricity of ferroelectric thin-film elements are mainly used. However, smaller sensors with higher reliability in comparison with the conventional sensors have been desired.

In order to reduce the sizes of sensors, the elements contained therein must be miniaturized. However, most of the existing ferroelectric thin-film elements (piezoelectric elements and pyroelectric elements) are formed by sintering, molding and machining ferroelectric ceramics, and although attempts have been made to reduce size and increase sensitivity, it is difficult to satisfy the demands for further miniaturization using the conventional techniques.

Therefore, development of a monolithic element combined with a semiconductor substrate is desired in which, using a new method, a sensing part, which is composed of a thin-film laminate including a ferroelectric thin film and metallic thin films for electrodes, is directly formed on the semiconductor substrate using a thin-film deposition technique, and the sensing part is machined by a fine patterning technique so as to have a diaphragm structure, a hollow structure or a cantilever structure. By forming the sensing portion with thin films as thus described, the size can be reduced and it is also possible to form the sensing part and a circuit part collectively on the same semiconductor substrate, and thus the size of the ferroelectric thin-film element can be further reduced. An attempt has also been made to improve the performance of an element by forming a Pb(Zr, Ti)O$_3$ (hereinafter referred to as "PZT") thin film or a (Pb, La)(Zr, Ti)O$_3$ (hereinafter referred to as "PLZT") thin film which has a particularly large remanence polarization and superior piezoelectricity and pyroelectricity on a substrate by oriented growth or epitaxial growth so as to obtain higher polarization.

However, the development of a monolithic ferroelectric thin-film element combined with a semiconductor substrate as described above gives rise to the problems described below. That is, there was a technical difficulty in forming a ferroelectric thin film having satisfactory orientation on a substrate using a thin-film deposition technique. A fine patterning technique such as etching was not established.

Although a ferroelectric thin-film element is disclosed in which a sensing part comprising a ferroelectric thin film and metallic thin films is formed on a single crystalline MgO substrate, the MgO substrate is expensive and is difficult to machine.

Accordingly, the objects of the present invention are to provide a small ferroelectric thin-film element which has high performance and which is inexpensive and easy to machine by using a technique for forming a ferroelectric thin film having superior orientation on a semiconductor substrate and by using various etching techniques on the substrate, metallic thin films and the ferroelectric thin film, and to provide a sensor using the same.

SUMMARY OF THE INVENTION

As a result of thorough research, the present inventors have found that by forming a buffer layer composed of MgO, $Ti_{1-x}Al_xN$ (where the subscript x is 0 to about 0.4), YSZ, or the like, it is possible to orientationally grow or epitaxially grow a metallic thin film and a ferroelectric thin film in that order on an Si substrate as a semiconductor substrate with the buffer layer therebetween. By using various etching techniques, the Si substrate and the buffer layer are partially removed to form a diaphragm structure, a hollow structure or a cantilever structure, and thus the present invention has been achieved.

In one aspect of the present invention, a ferroelectric thin-film element includes an Si substrate and a thin-film laminate formed on the Si substrate. The thin-film laminate includes a buffer layer epitaxially grown on the Si substrate, a lower electrode composed of a metallic thin film epitaxially grown on the buffer layer, a ferroelectric thin film orientationally grown or epitaxially grown on the lower electrode, and an upper electrode formed on the ferroelectric thin film. A portion of the thin-film laminate is disposed so as to be supported by the air.

A portion of the Si substrate located under the thin-film laminate may be etched to provide a recess or a through-hole in the Si substrate so that the thin-film laminate is disposed so as to be supported by air. Alternatively, a portion of the buffer layer may be etched so that the thin-film laminate is disposed so as to be supported by air. At least a portion of the buffer layer located on the recess or the through-hole of the Si substrate may be further etched so that the thin-film laminate is disposed so as to be supported by air.

In the present invention, by forming the buffer layer composed of an appropriate material, it is possible to orientationally grow or epitaxially grow the metallic thin film and the ferroelectric thin film on the Si substrate, and thus a small ferroelectric thin-film element with high performance can be easily formed. By etching portions of the Si substrate and the buffer layer using fine patterning techniques, the thin-film laminate composed of the metallic thin film, the ferroelectric thin film, etc., can be supported by air, and thus it is possible to easily machine a sensing part of the ferroelectric thin-film element so as to have a diaphragm structure, a hollow structure or a cantilever structure.

Preferably, the buffer layer is composed of at least one layer selected from the group consisting of an MgO layer, a $Ti_{1-x}Al_xN$ layer (where the subscript x is 0 to about 0.4) and a YSZ layer. By epitaxially growing these materials on the Si substrate, it becomes easy to epitaxially grow the lower electrode thereon.

Preferably, the lower electrode is composed of one material selected from the group consisting of Ir, Rh, Pt, SrRuO$_3$ and (La, Sr)CoO$_3$. By epitaxially growing these materials on the buffer layer, it becomes possible to orientationally grow or epitaxially grow the ferroelectric thin film thereon.

Preferably, the ferroelectric thin film is composed of a perovskite compound represented by the general formula ABO$_3$ (where A is at least one of Ba, Pb and La, and B is at least one of Ti, Zr, Mg, Nb and Zn). By orientationally growing or epitaxially growing these ferroelectrics on the substrate, a large polarization can be obtained and thus superior dielectric characteristics of the ferroelectric thin-film element can be obtained.

The ferroelectric thin-film elements can be used for various types of sensors, such as acceleration sensors and pyroelectric infrared sensors, and it will be possible to obtain smaller new sensors with higher reliability.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Hereinafter, the preferred embodiments of the present invention are explained in detail with reference to the drawings.

First Embodiment

In this embodiment, a ferroelectric thin-film element having a diaphragm structure and a method for making the same will be described with reference to FIGS. 1A to 1D which are sectional views showing the steps in the method for making the ferroelectric thin-film element having the diaphragm structure.

Figure 1A:
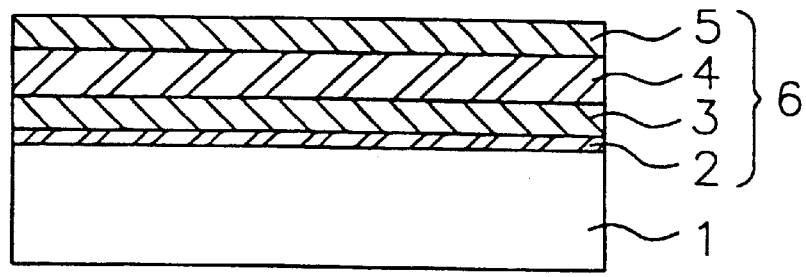
FIGS. 1A to 1D are sectional views showing the steps in a method for making a ferroelectric thin-film element having a diaphragm structure in a first embodiment of the present invention.

First, a thin-film laminate 6 as shown in FIG. 1A is formed on a substrate. Reference numeral 1 represents an Si substrate, and the thin-film laminate 6 includes a buffer layer 2 epitaxially grown on the Si substrate 1, a lower electrode 3 epitaxially grown on the buffer layer 2, a ferroelectric thin film 4 epitaxially grown on the lower electrode 3 and an upper electrode 5 formed on the ferroelectric thin film 4.

Although the methods for forming the individual thin films are not particularly limited, an Si(001) single crystalline substrate is prepared first as the Si substrate 1 in this embodiment, and the buffer layer 2 composed of an MgO thin film with a thickness of approximately 30 to 100 nm is formed on the Si substrate 1, using a pulsed laser deposition (PLD) system at 500 to 650° C. The resulting MgO thin film is an epitaxial film.

Next, similarly using the pulsed laser deposition (PLD) system, the lower electrode 3 composed of an Ir thin film with a thickness of approximately 100 to 200 nm is formed at 500 to 650° C. on the MgO thin film buffer layer 2. At this stage, the lattice length of Ir is very close to the lattice length of MgO, and the Ir thin film epitaxially grows on the MgO thin film.

The ferroelectric thin film 4 composed of a PZT thin film with a thickness of approximately 500 to 1,000 nm is formed on the resultant epitaxial Ir thin film at 600 to 700° C. using CVD. The resulting PZT thin film is an epitaxial film.

The upper electrode 5 composed of an Ir thin film with a thickness of approximately 100 to 200 nm is formed on the PZT thin film at room temperature by sputtering.

Figure 1B:
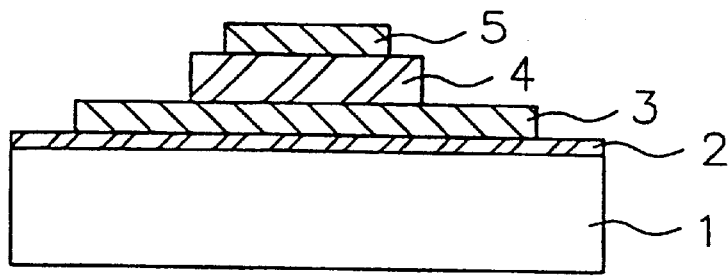

Next, as shown in FIG. 1B, the upper electrode 5, the ferroelectric thin film 4 and the lower electrode 3 are etched in that sequence. Specifically, a photoresist having a predetermined pattern is formed on the upper electrode 5 and then unnecessary portions of the Ir thin film, i.e. not corresponding to the upper electrode 5, are removed by etching using hot aqua regia. Next, similarly, a photoresist having a predetermined pattern is formed on the ferroelectric thin film 4 including the upper electrode 5, and unnecessary portions of the PZT thin film as the ferroelectric thin film 4 are removed by etching using ion etching. Next, similarly, a photoresist having a predetermined pattern is formed on the lower electrode 3 including the upper electrode 5 and the ferroelectric thin film 4, and unnecessary portions of the Ir thin film as the lower electrode 3 are removed by etching using ion etching.

Figure 1C:
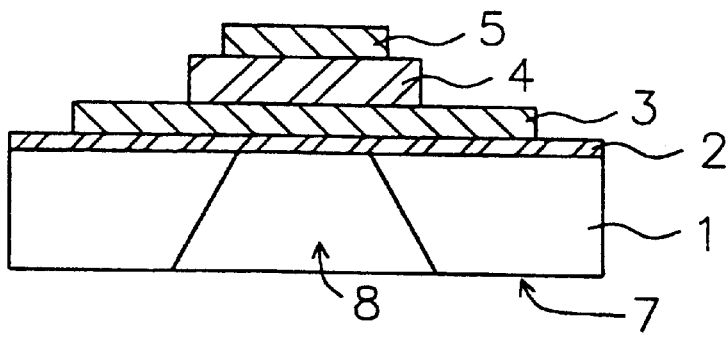
Figure 1D:
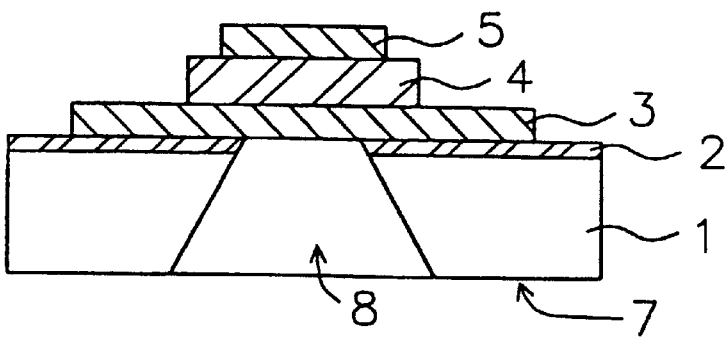

As shown in FIG. 1C, a photoresist is formed on an opposite surface 7 opposed to the surface of the Si substrate provided with the thin-film laminate 6, and the Si substrate 1 is subjected to anisotropic etching from the opposite surface 7 using TMAH. Thereby, a through-hole 8 is formed so as to reach the buffer layer 2 at a portion corresponding to the lower electrode 3, the ferroelectric thin film 4 and the upper electrode 5 which have been machined by etching.

Lastly, a portion of the buffer layer 2 corresponding to the through-hole 8 is removed by etching using hot phosphoric acid, and thus a ferroelectric thin-film element having a diaphragm structure is obtained in which the thin-film laminate 6 is disposed so as to be supported by air and lifted above the through-hole 8.

Additionally, although the Si(001) single crystalline substrate is used as the substrate in the embodiment described above, the present invention is not limited to this. An Si(111) substrate, an Si(110) substrate or the like may be used. Although the pulsed laser deposition (PLD) system is used to form the buffer layer 2 and the lower electrode 3 in the embodiment described, the present invention is not limited to this. The thin films may be formed using ion beam deposition, ion beam sputtering, electron beam deposition, molecular beam epitaxy (MBE), chemical vapor deposition (CVD), etc.

Although the epitaxially grown ferroelectric thin film 4 is formed on the epitaxially grown lower electrode 3 in this embodiment, the present invention is not limited to this. A ferroelectric thin film having high orientation of at least uniaxial orientation may be formed on the lower electrode 3 in the same manner.

Although the lower electrode 3, the ferroelectric thin film 4 and the upper electrode 5 are etched first and the Si substrate 1 is then etched in this embodiment, the sequence may be reversed.

Although the MgO thin film is used as the buffer layer 2, the present invention is not limited to this. As long as the thin film can be epitaxially grown on the Si substrate 1 and the lower electrode 3 can be epitaxially grown further thereon, a $Ti_{1-x}Al_xN$ thin film (where the subscript x is 0 to about 0.4), a YSZ thin film, or the like may be used.

Although the Ir thin film is used as the lower electrode 3, the present invention is not limited to this. As long as the thin film can be epitaxially grown on the buffer layer 2 and the ferroelectric thin film 4 can be orientationally grown or epitaxially grown further thereon, Rh, Pt, $SrRuO_3$ and (La, Sr)$CoO_3$, or the like may be used.

Although the PZT thin film, which has a particularly large remanence polarization and superior piezoelectricity and pyroelectricity among ferroelectrics, was used as the ferroelectric thin film 4, the present invention is not limited to this. A PLZT thin film which similarly has superior piezoelectricity and pyroelectricity may be formed. Instead of PZT or PLZT, a thin film of a perovskite compound represented by the general formula $ABO_3$ (where A is at least one of Ba, Pb and La, and B is at least one of Ti, Zr, Mg, Nb and Zn) may be formed. This is because of the fact that a large polarization can be obtained by forming films by oriented growth or epitaxial growth using these compounds, and thus the performance of dielectric elements can be improved.

Second Embodiment

In this embodiment, a ferroelectric thin-film element having a hollow structure and a method for making the same will be described with reference to FIGS. 2A to 2C which are sectional views showing the steps in the method for making the ferroelectric thin-film element having the hollow structure.

Figure 2A:
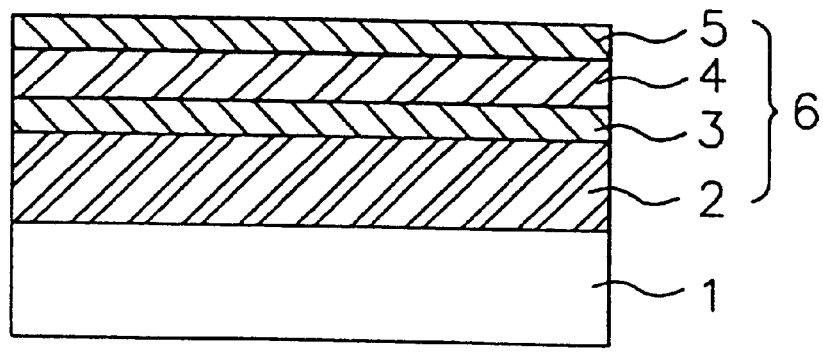
FIGS. 2A to 2C are sectional views showing the steps in a method for making a ferroelectric thin-film element having a hollow structure in a second embodiment of the present invention.

First, a thin-film laminate 6 as shown in FIG. 2A is formed on a substrate. In this embodiment, since a portion of a buffer layer 2 is removed by etching so that the removed portion is formed into a hollow structure, the buffer layer 2 is formed with a large thickness of approximately 1 to 10 μm. Since the structure other than this and the fabrication method are the same as those in the first embodiment, a description thereof will be omitted. Next, as shown in FIG. 2B, an upper electrode 5, a ferroelectric thin film 4 and a lower electrode 3 are etched in that sequence. Since the etching method is the same as that in the first embodiment, a description thereof is omitted.

Figure 2B:
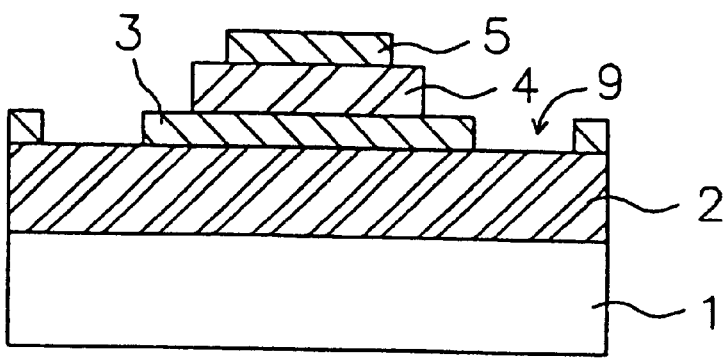
Figure 2C:
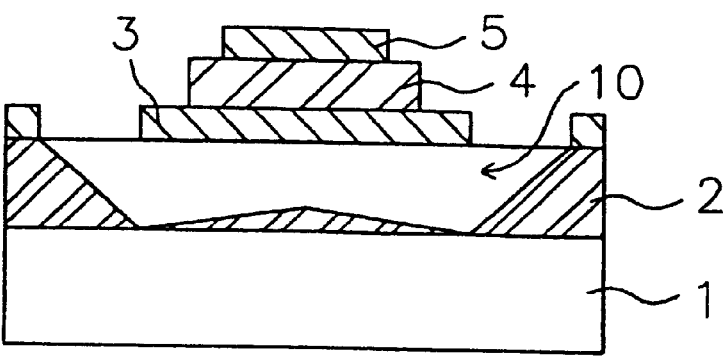

Next, as shown in FIGS. 2B and 2C, by removing a portion of the buffer layer by etching, a hollow structure is formed. Specifically, by continuously using the photoresist used for etching the lower electrode 3, the buffer layer 2 is etched through an opening 9 of the lower electrode 3 using hot phosphoric acid so that a recess 10 is formed in the buffer layer 2 at a portion corresponding to the lower electrode 3, the ferroelectric thin film 4 and the upper electrode 5 which have been etched. Thus, a ferroelectric thin-film element having a hollow structure is obtained in which the thin-film laminate 6 excluding the buffer layer 2 is disposed so as to be lifted above the recess 10.

Third Embodiment

In this embodiment, a ferroelectric thin-film element having a hollow structure and a method for making the same will be described with reference to FIGS. 3A to 3D which are sectional views showing the steps in the method for making the ferroelectric thin-film element having the hollow structure.

Figure 3A:
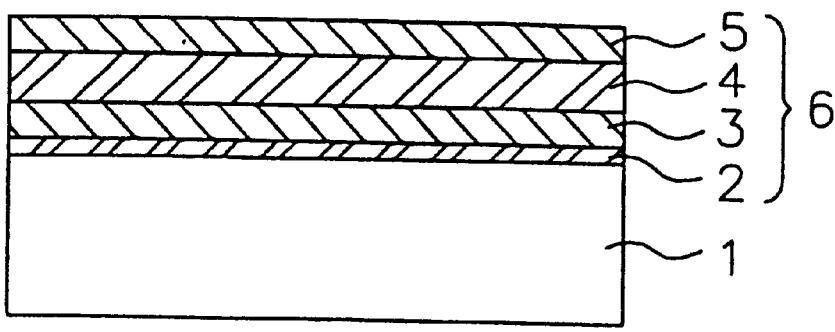
FIGS. 3A to 3D are sectional views showing the steps in a method for making a ferroelectric thin-film element having a hollow structure in a third embodiment of the present invention.
Figure 3B:
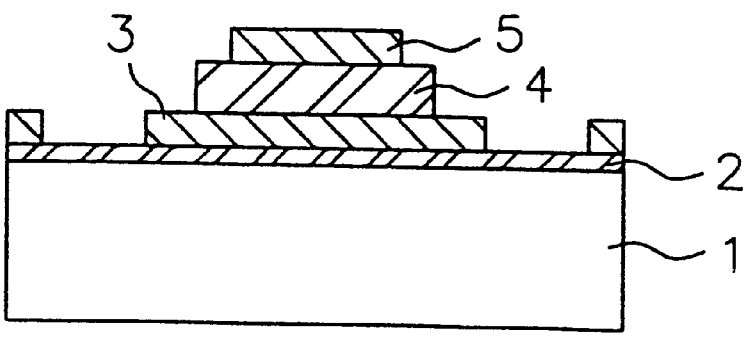

First, a thin-film laminate 6 as shown in FIG. 3A is formed on a substrate. Since the structure of the thin-film laminate 6 and the fabrication method are the same as those in the first embodiment, a description thereof will be omitted. Next, as shown in FIG. 3B, an upper electrode 5, a ferroelectric thin film 4 and a lower electrode 3 are etched in that sequence. Since the etching method is the same as that in the first embodiment, a description thereof is omitted.

Figure 3C:
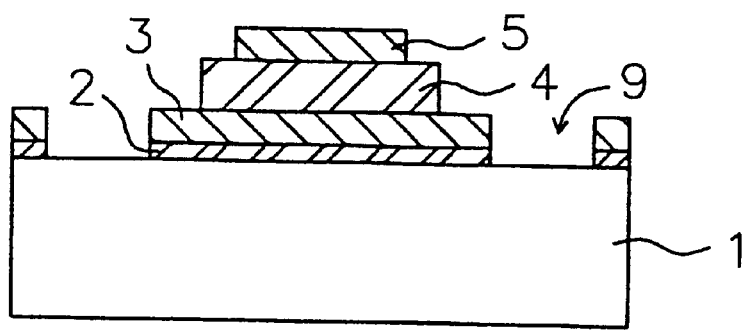

Next, as shown in FIG. 3C, a portion of the buffer layer 2 is removed by etching. Specifically, by continuously using the photoresist used for etching the lower electrode 3, the buffer layer 2 is etched using hot phosphoric acid. In this embodiment, since the buffer layer 2 is thin, and in this state, a recess is not formed in the buffer layer 2 at the portion corresponding to the lower electrode 3, the ferroelectric thin film 4 and the upper electrode 5 which have been etched so as to produce a hollow structure as is the case in the second embodiment.

Figure 3D:
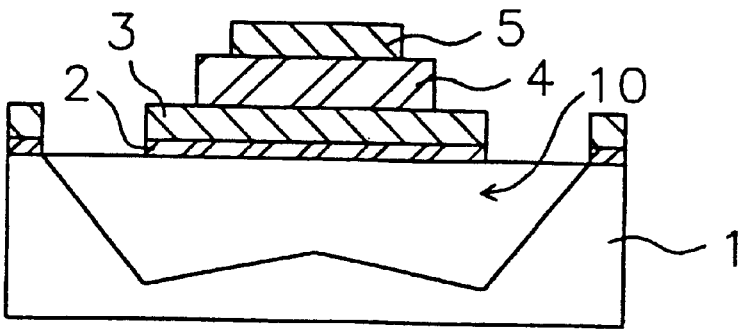

As shown in FIGS. 3C and 3D, a portion of the Si substrate 1 is removed by etching and the removed portion is formed into a hollow structure. Specifically, by continuously using the photoresist used for etching the lower electrode 3 and the buffer layer 2, the Si substrate 1 is etched through an opening 9 of the lower electrode 3 and the buffer layer 2 using hot phosphoric acid so that a recess 10 is formed in the Si substrate 1 at a portion corresponding to the lower electrode 3, the ferroelectric thin film 4 and the upper electrode 5 which have been etched. Thus, a ferroelectric thin-film element having a hollow structure is obtained in which the thin-film laminate 6 is disposed so as to be lifted above the recess 10 and be supported by air.

Fourth Embodiment

Figure 4:
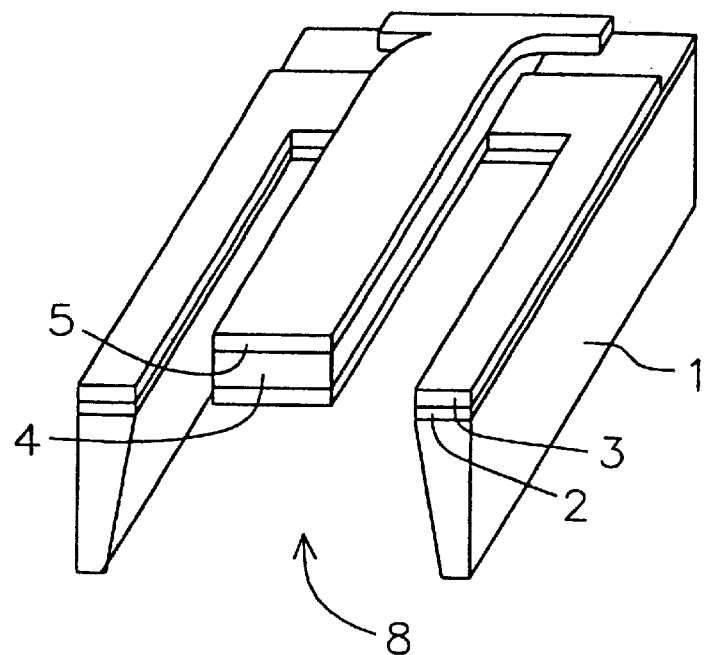
FIG. 4 is a perspective view showing a ferroelectric thin-film element fabricated by further machining the ferroelectric thin-film element having the diaphragm structure shown in the first embodiment.
Figure 5:
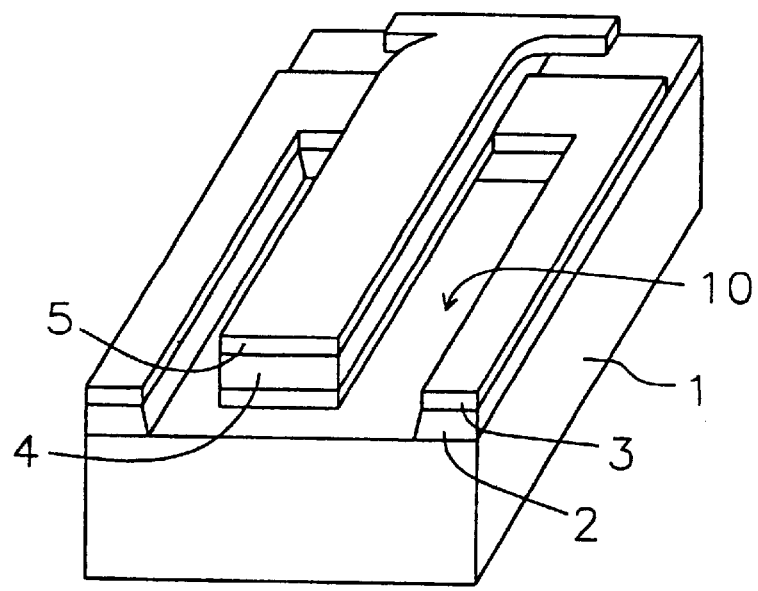
FIG. 5 is a perspective view showing a ferroelectric thin-film element fabricated by further machining the ferroelectric thin-film element having the hollow structure shown in the second embodiment.
Figure 6:
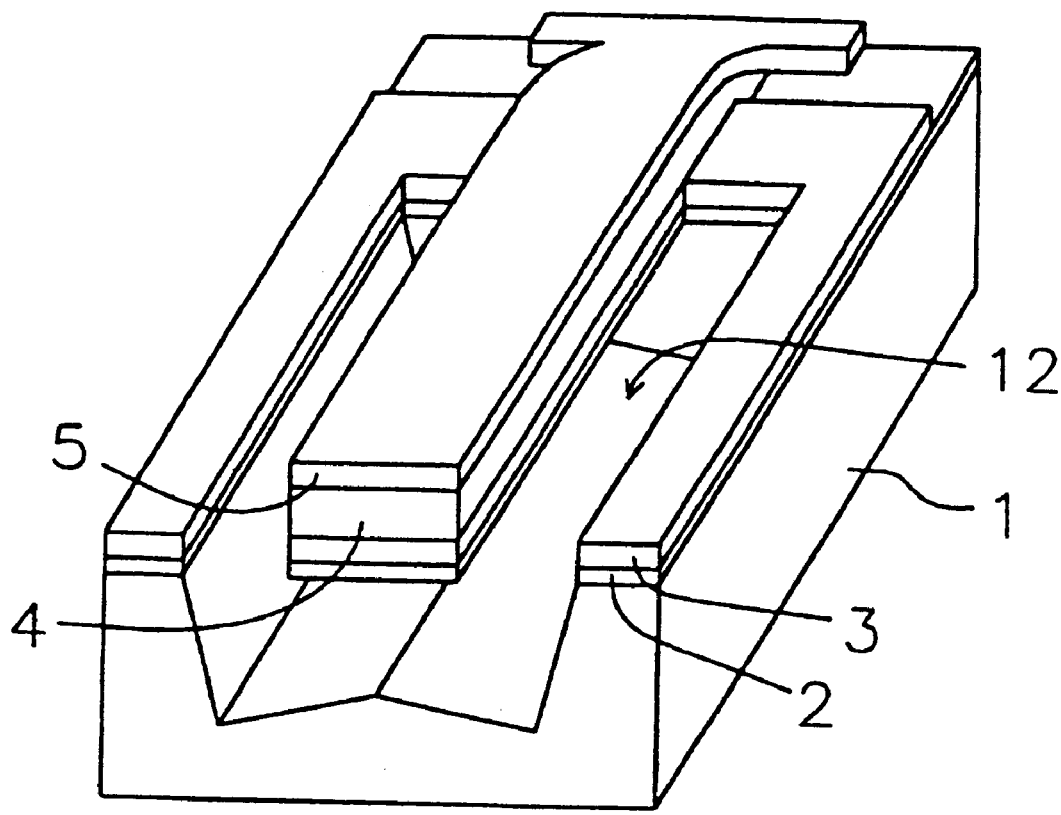
FIG. 6 is a perspective view showing a ferroelectric thin-film element fabricated by further machining the ferroelectric thin-film element having the hollow structure shown in the third embodiment.

In this embodiment, cantilever structures formed by further etching the ferroelectric thin-film elements formed in first to third embodiments, and a method for making the same will be described with reference to FIGS. 4 to 6. FIGS. 4 to 6 are perspective views showing the cantilever structures in this embodiment.

FIGS. 4, 5 and 6 show a ferroelectric thin-film element fabricated by further machining the ferroelectric thin-film element having the diaphragm structure shown in the first embodiment, a ferroelectric thin-film element fabricated by further machining the ferroelectric thin-film element having the hollow structure shown in the second embodiment and a ferroelectric thin-film element fabricated by further machining the ferroelectric thin-film element having the hollow structure shown in the third embodiment, respectively. By using ion etching, unnecessary portions of the thin-film laminates 6 are removed to produce the cantilever structures.

Additionally, the method for machining the cantilever structure is not limited to the one described in this embodiment, and the individual layers may be formed into the shapes according to this embodiment in the etching steps for the thin-film laminates 6 in the first to third embodiments.

Additionally, by using the same machining method as that for the cantilever structures described above, a two-point support structure and a four-point support structure may be formed.

The ferroelectric thin-film elements fabricated in the first to fourth embodiments described above are used for various types of sensors, such as acceleration sensors and pyroelectric infrared sensors, and will also be usable for various electronic components, such as thin-film capacitors and microactuators.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A method for making a ferroelectric thin-film element comprising an Si substrate and a thin-film laminate formed on the Si substrate, a portion of the thin-film laminate being disposed so as to be unsupported, the method comprising the steps of:

epitaxially growing a buffer layer on the Si substrate;

forming a lower electrode by epitaxially growing a metallic thin film on the buffer layer;

orientationally growing or epitaxially growing a ferroelectric thin film on the lower electrode;

forming an upper electrode on the ferroelectric thin film; and removing a portion of the buffer layer to form a recess in the buffer layer such that a part of the thin-film laminate is unsupported, wherein said recess does not extend to a bottom surface of the ferroelectric thin-film.

2. A method for making a ferroelectric thin-film element according to claim 1, wherein the removing step comprises etching a portion of the buffer layer.

3. A method for making a ferroelectric thin-film element according to claim 1, wherein the step removing comprises etching a portion of the buffer layer without etching the Si substrate.

4. A method for making a ferroelectric thin-film element according to claim 3, further comprising etching at least a portion of the buffer layer located adjacent the recess or through-hole of the Si substrate.

5. A method for making a ferroelectric thin-film element according to claim 1, wherein the buffer layer comprises at least one member selected from the group consisting of an MgO layer, a $Ti_{1-x}Al_xN$ layer where x is 0 to about 0.4 and a YSZ layer.

6. A method for making a ferroelectric thin-film element according to claim 5, wherein the lower electrode comprises a material selected from the group consisting of Ir, Rh, Pt, $SrRuO_3$ and $(La, Sr)CoO_3$, and wherein the ferroelectric thin film comprises a perovskite compound represented by the general formula $ABO_3$ where A is at least one of Ba, Pb and La, and B is at least one of Ti, Zr, Mg, Nb and Zn.

7. A method for making a ferroelectric thin-film element according to claim 1, wherein the lower electrode comprises a material selected from the group consisting of Ir, Rh, Pt, $SrRuO_3$ and $(La, Sr)CoO_3$.

8. A method for making a ferroelectric thin-film element according to claim 1, wherein the ferroelectric thin film comprises a perovskite compound represented by the general formula $ABO_3$ where A is at least one of Ba, Pb and La, and B is at least one of Ti, Zr, Mg, Nb and Zn.

9. A method for making a ferroelectric thin-film element comprising an Si substrate and a thin-film laminate formed on the Si substrate, a portion of the thin-film laminate being disposed so as to be unsupported, the method comprising the steps of:

epitaxially growing a buffer layer on the Si substrate;

forming a lower electrode by epitaxially growing a metallic thin film on the buffer layer;

orientationally growing or epitaxially growing a ferroelectric thin film on the lower electrode;

forming an upper electrode on the ferroelectric thin film; and removing a portion of the Si substrate and the buffer layer to form a recess in the Si substrate such that a part of the thin-film laminate is unsupported, wherein said recess does not extend to a bottom surface of the ferroelectric thin-film.

* * * * *